(12) United States Patent
Nitschke et al.

(10) Patent No.: US 6,449,544 B1
(45) Date of Patent: Sep. 10, 2002

(54) METHOD FOR OPERATING A RESTRAINT SYSTEM CONNECTED BY A BUS LINE IN CASE OF A SHORT CIRCUIT

(75) Inventors: Werner Nitschke, Ditzingen; Otto Karl, Leonberg; Joachim Bauer, Oberstenfeld-Prevorst; Michael Bischoff, Adelschlag; Günter Fendt, Schrobenhausen; Johannes Rinkens, Ingolstadt; Stefan Schaefer, Schrobenhausen, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/647,383

(22) PCT Filed: Mar. 26, 1999

(86) PCT No.: PCT/DE99/00938

§ 371 (c)(1),
(2), (4) Date: Jan. 2, 2001

(87) PCT Pub. No.: WO99/50102

PCT Pub. Date: Oct. 7, 1999

(30) Foreign Application Priority Data

Mar. 28, 1998 (DE) .......................................... 198 13 922

(51) Int. Cl.⁷ ........................... B60R 21/00; G01R 31/00
(52) U.S. Cl. ........................... 701/45; 701/29; 180/268; 280/728.1
(58) Field of Search ...................... 701/45, 29; 180/268; 280/728.1, 733, 734, 735, 801.1

(56) References Cited

U.S. PATENT DOCUMENTS

| | | | | |
|---|---|---|---|---|
| 5,357,518 A | * | 10/1994 | Peter .............................. | 714/4 |
| 5,534,848 A | * | 7/1996 | Steele et al. .............. | 280/5.501 |
| 5,825,098 A | * | 10/1998 | Darby et al. ................ | 307/10.1 |
| 5,835,873 A | * | 11/1998 | Darby et al. ................. | 180/268 |
| 6,046,511 A | * | 4/2000 | Kincaid .................... | 280/728.1 |
| 6,052,635 A | * | 4/2000 | Swart et al. ................. | 280/735 |

FOREIGN PATENT DOCUMENTS

| DE | 195 03 460 | 3/1996 |
|---|---|---|
| DE | 196 25 401 | 9/1997 |
| DE | 196 47 668 | 5/1998 |

OTHER PUBLICATIONS

J. Bauer et al., "Bussytem zur Vernetzung von Aktuatoren für Rückhaltesysteme," Conference Proceedings of the SAE International Congress & Exposition (Feb. 24–27, 1997).**

* cited by examiner

Primary Examiner—Michael J. Zanelli
Assistant Examiner—Eric M Gibson
(74) Attorney, Agent, or Firm—Kenyon & Kenyon

(57) ABSTRACT

In the restraint system, a central control unit and a plurality of data processing units are coupled to a bus line, each of the data processing units being provided to activate one or more restraint devices. In order to keep the restraint system operational to the extent possible in the event of a short circuit, each data processing unit measures for short circuits on the bus line and starts timing if a short circuit is detected. Each data processing unit has a circuit breaker, with which the bus line can be closed or interrupted. This circuit breaker is opened if the short circuit measured is longer than a preset waiting time.

4 Claims, 2 Drawing Sheets

METHOD FOR OPERATING A RESTRAINT SYSTEM CONNECTED BY A BUS LINE IN CASE OF A SHORT CIRCUIT

FIELD OF THE INVENTION

The present invention relates to a method for operating a restraint system, networked via a bus line, in the event of a short circuit on the bus line, including a central control unit and a plurality of data processing units connected to the bus line, each of the data processing units serving to activate one or more restraint devices.

BACKGROUND INFORMATION

The capabilities of vehicle restraint systems will increase substantially in the future in order to afford passengers still greater protection. This means that there will be a tremendous increase in the number of restraint devices and associated triggering means installed in vehicles. Examples of such restraint devices are driver and front-passenger airbags, which can be activated in multiple stages, driver and front-passenger knee bags, side airbags for the driver and the front-seat and back-seat passengers, such side airbags optionally being provided for both the head and chest areas, seat-belt pretensioners, which also can be activated in multiple stages, optionally also roll bars, etc. A complex protection system composed of multiple restraint devices for each-passenger will thus be installed in vehicles.

A complex restraint system is described in the German Patent Application No. 47 668.2 and in the Conference Proceedings of the SAE International Congress and Exposition, Feb. 24–27, 1997, Detroit, in the paper "Bussystem zur Vernetzung von Aktuatoren für Rückhaltesysteme" ["Bus System for Networking Actuators for Restraint Systems"] by J. Bauer, G. Mehler and W. Nitschke. Implementation of a bus system networking all the restraint devices together made it possible to avoid the use of bulky cable harnesses. In this conventional system, provided for each restraint device is a data processing unit, including a processor, data input and output circuits, a memory unit, a time and clock base and a power supply. This data processing unit, also described as a peripheral intelligent driver stage, is located in the immediate vicinity of the triggering device belonging to the respective restraint device, namely, in a firing-pellet connector or a substrate of the firing pellet itself.

Each data processing unit receives its power from a central control unit, via a bus line. In addition, the central control unit determines which restraint devices are to be triggered, on the basis of a plurality of control signals, for example, from acceleration sensors, pre-crash sensors and seat-occupancy sensors. Accordingly, with the aid of a protocol transmitted over the bus line, the central control unit addresses the data processing units concerned. In addition, requests for diagnostic activity are transmitted from the central control unit via the bus line to the individual data processing units, which in turn send their diagnostic responses back to the central control unit via the bus.

As already described in German Patent Application No. 196 47 668.2, failure of the entire restraint system is to be prevented in the event of a short circuit occurring on the bus line, if at all possible. To this end, the central control unit measures short-circuit current on the bus line, and localizes the short circuit by interacting with the data processing units connected to the bus line. This makes it possible for at least all the data processing units located between the central control unit and the short circuit to remain operational, with only those data processing units downstream of the short circuit no longer being accessible to activation by the central control unit. The bus system constructed in this way thus has a certain tolerance for short circuits.

SUMMARY OF THE INVENTION

An object of the present invention is to specify a device of the which, as far as possible, maintains the entire restraint system operational in the event of a short circuit on the bus line.

The objective is achieved in that data processing unit in that each data processing unit connected to the bus line measures for short circuits on the bus line. If a short circuit is detected, the data processing unit then starts timing, and opens a circuit breaker contained within it, with which the bus line can be closed or interrupted, if the short circuit measured lasts longer than a preset waiting period.

As all the data processing units used to activate various restraint devices are themselves actively involved in detecting a short circuit, an optimum short-circuit tolerance in the restraint system can be achieved. Namely, the duration of the short circuit is taken into account, such that in the event of a short circuit of only brief duration, the entire restraint system is maintained in an operational state, and in the event of a longer short circuit, at least those data processing units located between the central control unit and the localized short circuit remain active. As a result, a short circuit on the bus line does not inevitably lead to a total failure of the entire restraint system.

The data processing unit can be shifted into a reset state if the duration of the short circuit measured is several times longer than the waiting period after which the circuit breaker is opened.

In practical terms, the central control unit performs a short-circuit measurement on the bus line, starts a time measurement with the commencement of a short circuit, and switches off its power supply to the data processing units connected to the bus line if the short-circuit duration measured by it exceeds a preset hold time. This hold time is shorter than the delay for the opening of the circuit breakers in the data processing units. The central control unit switches the power supply for the data processing units back on again after the latter have opened their circuit breakers. As a result, operation of those data processing units which are disposed between the central control unit and the location of the short circuit can be maintained.

When a triggering command for the restraint devices has to be transmitted after the onset of a short circuit, the central control unit transmits it several times via the bus line, such that after a short circuit of very brief duration, a triggering command will be guaranteed to reach all data processing units concerned.

DETAILED DESCRIPTION

Figure 1:
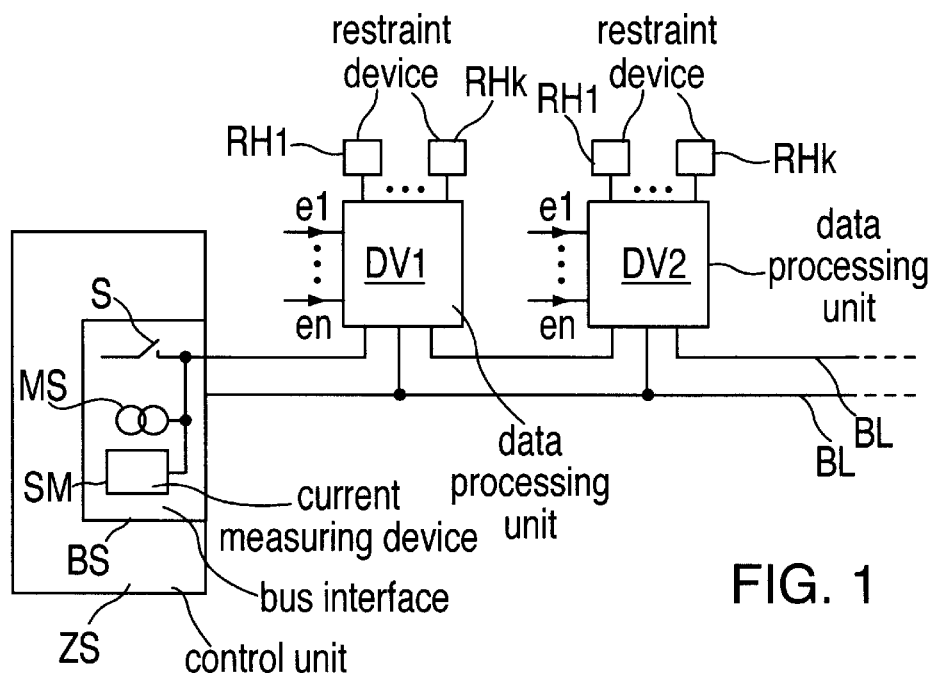
FIG. 1 shows a block diagram of a restraint system according to the present invention.

FIG. 1 shows a section of a restraint system, including a central control unit ZS, a bus line BL connected to it and a plurality of data processing units DV1, DV2 coupled to bus line BL. Bus line BL is embodied here as a stub line, but it can equally well be in the form of a ring circuit. Central control unit ZS, in addition to a logic or signal processing device not shown here, also includes a bus interface BS. This bus interface BS includes a circuit breaker S, a measured-current source MS, a current-measuring device SM and signal drivers, which, however, are not shown here because they are not relevant to the present invention. Central control unit ZS can be connected to or disconnected from bus line BL by way of circuit breaker S; in other words, power-supply and/or control signals can be passed through from central control unit ZS to data processing units DV1, DV2, or their transmission can be interrupted, via circuit breaker S.

Figure 2:
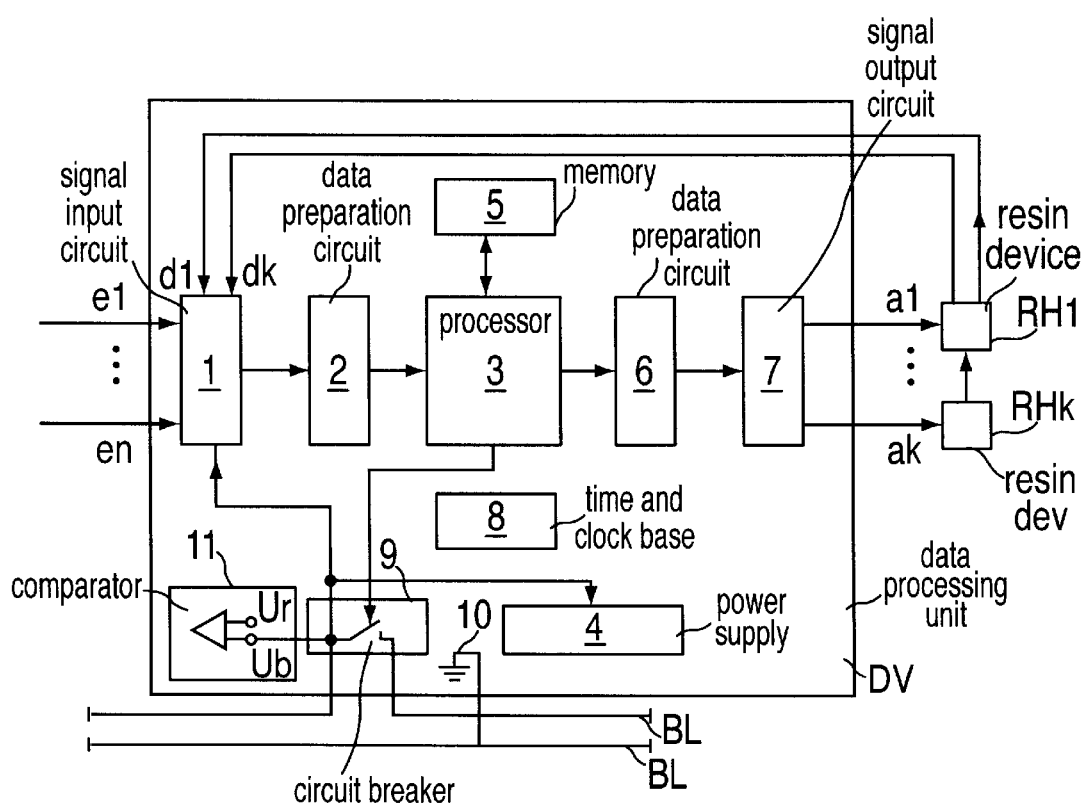
FIG. 2 shows a block diagram of a data processing unit according to the present invention.

All of data processing units DV1, DV2, two of which are shown as examples, have the same circuit pattern as illustrated in FIG. 2, and will be explained in detail below. Each of data processing units DV1, DV2 provided is used to activate one or more restraint devices RH1, . . . RHk. These restraint devices include, for example, airbags for the driver and the front passenger, which can be activated in multiple stages; driver and front-passenger knee bags; side airbags for the driver, the front passenger and the rear passengers; seat-belt pretensioners, etc. In addition to the connections to the bus line, data processing devices DV1, DV2 also have additional inputs e1, . . . en, for example, for signals from acceleration sensors and/or pre-crash sensors and/or seat occupancy sensors. These data processing units DV1, DV2 are thus able to activate one or more restraint devices RH1, . . . RHk autonomously and independently of control signals from central control unit ZS.

FIG. 2 shows the circuit structure of a data processing unit DV. The group of k restraint devices RH1 to RHk connected to this data processing unit DV may be assigned to one vehicle occupant, for example. If this is the front passenger, for example, then restraint devices RH1 to RHk could include a front airbag, one or two side airbags in the head and chest areas, a knee airbag and a seat-belt pretensioner, with the possibility of triggering all air bags and the seat-belt pretensioner in multiple stages.

In the event of a crash, data processing unit DV generates a triggering signal a1 to ak for restraint devices RH1, . . . RHk; the restraint devices to be triggered and the triggering times may be selected as a function of a plurality of input signals e1 to en. Input signals e1 to en come from sensors, which may include one or more acceleration sensors for sensing the kinetic behavior of the vehicle in a crash, pre-crash sensors, a seatbelt-buckle sensor and seat-occupancy sensors. On the basis of the signals from the seat-occupancy sensors, data processing unit DV concludes whether the front-passenger seat is occupied at all, whether a child or adult is sitting in it, and also in what position the passenger is sitting, so that only those restraint devices will be triggered accordingly which are in fact able to offer protection, rather than perhaps even harming the person. In the same way, the triggering of restraint devices is completely suppressed if the front-passenger seat is not even occupied or if a child seat or an item of luggage is on it.

FIG. 2 illustrates the individual functional elements within data processing unit DV, in the form of blocks. There is a signal input circuit 1 to receive analog or digital input signals e1 to en, containing signal drivers, for example, and possibly also a multiplexer for the conversion of input signals received in parallel into a serial data stream. In adjacent data preparation circuit 2, analog input signals may be subjected to an analog-digital conversion; in any event, at this stage the data are prepared in such a way that they can be digitally further processed by a downstream processor 3.

Processor 3 carries out all control functions in data processing unit DV. For example, it determines on the basis of input signals e1 to en which of the connected restraint devices RH1 to RHk should be triggered at what times. It also performs diagnostics on the firing components in restraint devices RH1 to RHk. To that end, diagnostic signals d1 to dk—for example, the resistance values of the firing components—are supplied to signal input circuit 1. Processor 3 compares diagnostic signals d1 to dk to reference values and outputs an error message in the event of unacceptable deviations. Additionally, diagnostics are performed on an energy reserve located in a power supply unit 4.

A memory unit 5 is used to store temporary data, such as resistances of the firing components, the power levels of the energy reserve, etc. Similarly, production-specific data and identification data can be stored in memory unit 5. Processor 3 can access the data in memory unit 5 and can write new data to the memory unit 5.

In a similar arrangement to the input side of data processing unit DV, there is on the output side downstream of processor 3 a data preparation circuit 6 and a signal output circuit 7. In data preparation circuit 6, for example, the digital triggering information or diagnostic scan signals from process or 3 are converted into firing currents or test currents for the firing components of restraint devices RH1 to RHk. Signal output circuit 7 is equipped with signal drivers and may also be equipped with a demultiplexer, which splits up a serial flow of output signal data into individual parallel output signals a1 to ak.

A time and clock base 8 in data processing unit DV supplies all functional blocks with a uniform and synchronous clock pulse.

It is evident that the arrangement of the functional blocks shown in FIG. 1 is not mandatory, but merely illustrative. For example, signal input circuit 1 and data preparation circuit 2, or signal output circuit 6 an d data preparation circuit 7, could be combined and could also be at least partially integrated into processor 3. Similarly, power supply 4 and/or time and clock base 8 can be integrated into data preparation circuits 2, 6. There are many different possibilities of incorporating multiple functions into one circuit block.

However, for the functions of the present invention described in more detail below, it is not a requirement that the data processing units be autonomous systems in accordance with the preceding description. Decisions on the triggering of restraint devices m ay also b e made by central control unit ZS alone and communicated to the individual data processing units via bus line BL. Similarly, the diagnostics on restraint devices RH1, . . . RHk and data processing units DV1, DV2 can be implemented from central control unit ZS.

As illustrated in FIG. 2, data processing unit DV is equipped with a circuit breaker 9, which makes it possible to isolate bus BL and/or to connect it to the nearest data processing unit. The opening and closing of circuit breaker 9 is controlled by processor 3. A request to close or open circuit breaker 9 can be transmitted from central control unit ZS via bus line BL. This then makes it possible to activate individual data processing units as specifically required, and to supply them with information, control signals and power signals. The grounding line of bus BL, which here is in the form of a two-wire line, is contacted to a common ground connection 10 in data processing unit DV. The other line of bus BL is used to deliver the information and control signals transmitted from central control unit ZS to signal input circuit 1 and the power-supply signals to power supply unit 4.

Data processing unit DV incorporates a comparator 11, which taps voltage Ub on bus BL and compares it to a reference voltage Ur. This comparison makes it possible to determine whether bus voltage Ub has collapsed as a result of a short circuit on bus line BL.

Figure 3:
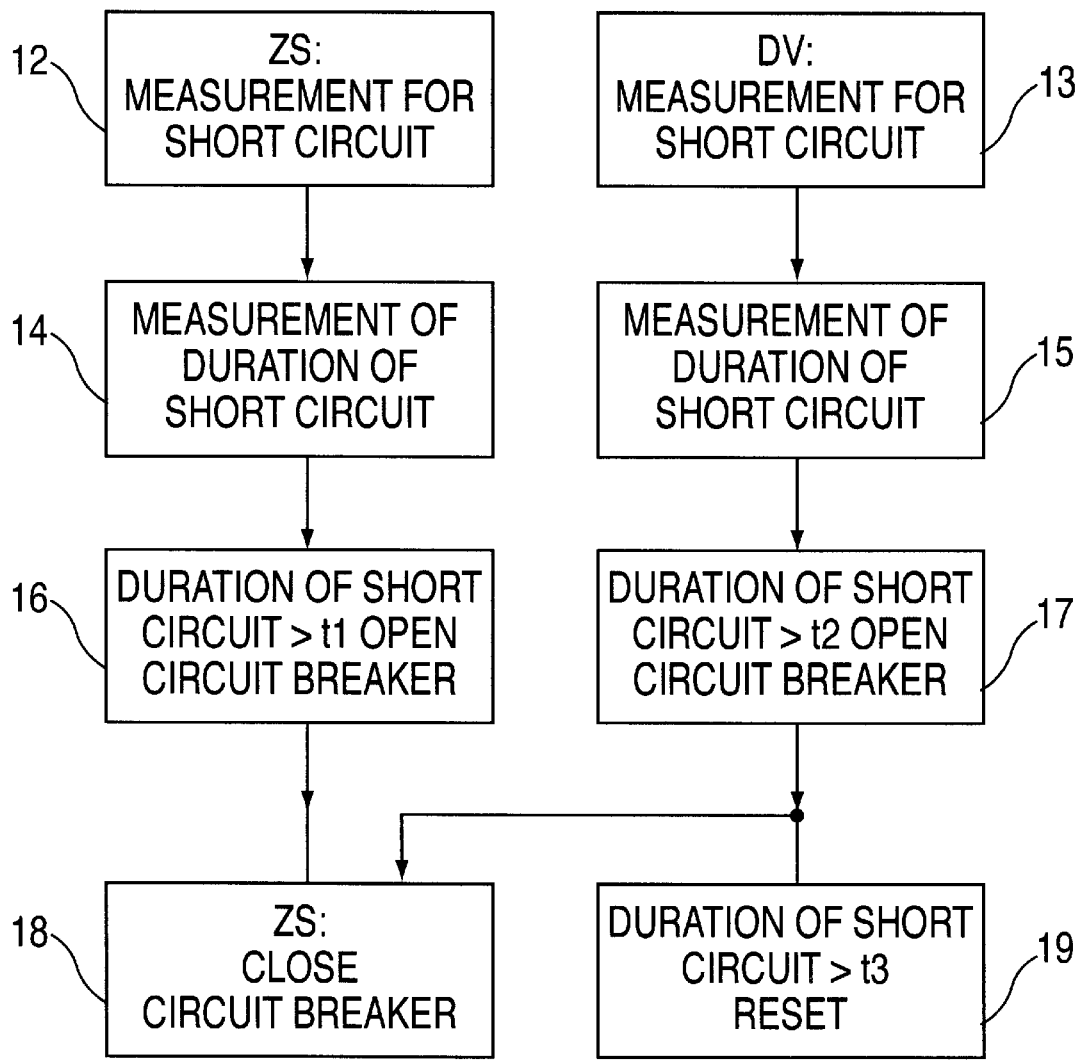
FIG. 3 shows a flow diagram illustrating a method according to the present invention.

It will now be described on the basis of the flow diagram in FIG. 3 how data processing units DV and central control unit ZS act in the event of a short circuit, in order to keep the entire restraint system operational to the extent possible. As indicated in blocks 12 and 13, both central control unit ZS and all of data processing units DV measure for short circuits on bus line BL. As described above, the measurement within data processing units DV is carried out using a voltage comparator 11. Central control unit ZS has a measured-current source MS and a current-measuring device SM for the short-circuit measurement in its bus interface BS. As soon as a short circuit occurs on bus line BL, current-measuring device SM detects a change in the current fed to the bus line from measured-current source MS.

As shown in blocks 14 and 15, both the central control unit and the data processing units measure the duration of the short circuit. Both central control unit ZS and data processing units DV begin timing as soon as the occurrence of a short circuit on the bus line is detected. If central control unit ZS, as shown in block 16, measures a duration for the short circuit which is longer than a time t1, it opens its circuit breaker S. This hold time t1 amounts, for example, to 100 microseconds. When circuit breaker S in central control unit ZS is open, data processing units DV are isolated from the power supply in central control unit ZS. At that point, data processing units DV draw their power from the reserve in their power supply unit 4. If the short circuit comes to an end within a time which is shorter than hold time t1, then the entire restraint system is unaffected. This is because central control unit ZS sends triggering commands repeatedly one after the other, so that one of the multiple triggering commands transmitted is guaranteed to reach the relevant data processing units DV after the short circuit.

As shown in block 17 of the flow diagram, data processing units DV also open their circuit breakers 9 if they measure a short circuit which is longer than a time t2. This waiting time t2 is about one millisecond. Times t1 and t2 for the opening of the circuit breakers are made so different in order to avoid interplay between the switching processes in central control unit ZS and in data processing units DV, thereby avoiding oscillation throughout the entire bus system. The stipulation of the two times t1 and t2 is based on the shortest triggering-reaction time in the restraint system, with the primary deciding factor being the very short triggering time for side airbags.

The opening of circuit breakers 9 in data processing units DV has the effect that the short circuit for central control unit ZS is canceled. As, if at a location upstream of the short circuit, the bus line has been interrupted by one or more circuit breakers 9 in data processing units DV, central control unit ZS will no longer detect a short circuit. At that point, central control unit ZS will then close its circuit breaker S once again, as shown in block 18, and current can then be supplied at least to those data processing units DV which are located between central control unit ZS and the location of the short circuit. Consequently, the restraint system is at least partially still operational.

If, however, the duration of the short circuit measured in data processing units DV is longer than a preset time t3, the energy reserve in data processing units DV will be consumed and all data processing units DV will carry out a reset, as indicated in block 19. Time t3 is shorter than one second.

What is claimed is:

1. A method for operating a restraint system, networked via a bus line, in an event of a short circuit on the bus line, comprising the steps of:

coupling a central control unit and a plurality of data processing units to the bus line, each data processing unit being adapted to activate at least one restraint device;

measuring, by each data processing unit, for a short circuit on the bus line;

beginning a timing, by a particular data processing unit, when the short circuit is detected; and opening a circuit breaker, located inside the particular data processing unit if the measured short circuit has a time duration that is longer than a preset waiting time, the circuit breaker at least one of closing and interrupting the bus line.

2. A method for operating a restraint system, networked via a bus line, in an event of a short circuit on the bus line, comprising the steps of:

coupling a central control unit and a plurality of data processing units to the bus line, each data processing unit being adapted to activate at least one restraint device;

measuring, by each data processing unit, for a short circuit on the bus line;

beginning a timing, by a particular data processing unit, when the short circuit is detected;

opening a circuit breaker, located inside the particular data processing unit if the measured short circuit has a time duration that is longer than a preset waiting time, the circuit breaker at least one of closing and interrupting the bus line; and shifting the particular data processing unit into a reset state if the measured short circuit has a time duration that is several times longer than the preset waiting time after which the circuit breaker is opened.

3. A method for operating a restraint system, networked via a bus line, in an event of a short circuit on the bus line, comprising the steps of:

coupling a central control unit and a plurality of data processing units to the bus line, each data processing unit being adapted to activate at least one restraint device;

measuring, by each data processing unit, for a short circuit on the bus line;

beginning a timing, by a particular data processing unit, when the short circuit is detected;

opening a circuit breaker, located inside the particular data processing unit if the measured short circuit has a time duration that is longer than a preset waiting time, the circuit breaker at least one of closing and interrupting the bus line;

measuring, by the central control unit, for the short circuit on the bus line;

beginning a timing, by the central control unit, when the short circuit occurs;

switching off a power supply to the plurality of data processing units, coupled to the bus line, if the time duration of the measured short circuit, by the central control unit, exceeds a preset hold time, the preset hold time being shorter than the preset waiting time; and switching on the power supply to the plurality of data processing units, coupled to the bus line, after the plurality of data processing units have opened their circuit breakers.

4. A method for operating a restraint system, networked via a bus line, in an event of a short circuit on the bus line, comprising the steps of:

coupling a central control unit and a plurality of data processing units to the bus line, each data processing unit being adapted to activate at least one restraint device;

measuring, by each data processing unit, for a short circuit on the bus line;

beginning a timing, by a particular data processing unit, when the short circuit is detected;

opening a circuit breaker, located inside the particular data processing unit if the measured short circuit has a time duration that is longer than a preset waiting time, the circuit breaker at least one of closing and interrupting the bus line; and transmitting repeatedly, by the central control unit, over the bus line any triggering signal for the at least one restraint device that has to be transmitted after the short circuit occurs.

* * * * *